United States Patent [19]

Kabacoff et al.

[11] Patent Number: 4,939,041
[45] Date of Patent: Jul. 3, 1990

[54] METAL FILM COATINGS ON AMORPHOUS METALLIC ALLOYS

[75] Inventors: Lawrence T. Kabacoff, Columbia, Md.; Kristl B. Hathaway, Arlington, Va.

[73] Assignee: The United States of America as represented by the Secretary of the Navy, Washington, D.C.

[21] Appl. No.: 377,997

[22] Filed: Jul. 11, 1989

[51] Int. Cl.$^5$ ............... B32B 15/02; C23C 14/35
[52] U.S. Cl. ............... 428/607; 428/653; 428/672; 428/673; 428/677; 428/931; 204/192.15; 204/192.2
[58] Field of Search ........... 204/192.15, 192.2, 192.17; 428/607, 676, 677, 653, 673, 672, 928, 931; 174/35 MS

[56] References Cited

U.S. PATENT DOCUMENTS

| | | | |
|---|---|---|---|
| 4,126,287 | 11/1978 | Mendelsohn et al. | 174/35 MS |
| 4,163,821 | 8/1979 | Nienart et al. | 174/35 MS |
| 4,189,618 | 2/1980 | Bretts et al. | 174/35 MS |
| 4,231,816 | 11/1980 | Cuomo et al. | 204/192.15 |
| 4,258,756 | 3/1981 | Gilman et al. | 174/35 MS |
| 4,340,770 | 7/1982 | Bridges | 174/35 MS |
| 4,749,625 | 6/1988 | Obryashi et al. | 428/624 |
| 4,763,030 | 8/1988 | Clark | 148/403 |

FOREIGN PATENT DOCUMENTS

| | | | |
|---|---|---|---|
| 3536728 | 4/1986 | Fed. Rep. of Germany | 428/658 |
| 51-23438 | 2/1976 | Japan | 428/625 |
| 61-16978 | 1/1986 | Japan | 428/658 |
| 63-216961 | 9/1988 | Japan | 204/192.15 |

Primary Examiner—John J. Zimmerman
Attorney, Agent, or Firm—Kenneth E. Walden; Roger D. Johnson

[57] ABSTRACT

Coating of crystalline metals (Ag, Au, Cu, Al) are formed on amorphous metallic alloys (glassy metals) by cathode magnetron sputtering. The process can be used to produce new products such as copper coated amorphous metallic alloy wires for torpedo controls, shielding materials for electromagnetic waves, and anticorrosion coatings for Fe-metalloid magnetostrictive elements.

19 Claims, No Drawings

METAL FILM COATINGS ON AMORPHOUS METALLIC ALLOYS

BACKGROUND OF THE INVENTION

This invention relates to metal alloys and more particularly to amorphous metal alloys.

Fe-metalloid amorphous metallic alloy ribbons, when properly annealed in a transverse magnetic field, exhibit extremely high magnetomechanical coupling. These materials are the most strain sensitive materials known, with strain-gauge figures of merit of about $4 \times 10^5$. Technological exploitation of these materials is made difficult by a number of factors (in addition to the ones inherent in using extremely stress sensitive materials). The ribbons have very high surface-to-volume ratios, greatly exaggerating the importance of surface effects, especially the effect of surface nonuniformity. Another problem is that Fe-metalloid amorphous metallic alloys are extremely prone to corrosion, even in moderately humid air. Conventional protective coating against corrosion place stresses on these materials which render them useless for measuring strains.

Other amorphous metallic alloys (or glassy metals) have desirable properties such as high strength, corrosion resistance, high magnetic permeabilities, etc. Nevertheless these materials are limited in their uses by their high resistivity (about 130 to 160 microohms-cm). Moreover, conventional electroplating can not be used to form metal (e.g., Cu, Ag, Au) coatings on these amorphous metallic alloys. Proprietary methods of electroplating the amorphous metallic alloys appear to be complicated and very expension.

Untika, Inc., of Japan has produced amorphous metallic alloy wires containing chromium which have high strength and resistance to corrosion. Filaments of these amorphous metallic alloys would be useful for reinforcing rubber structures such as tires and sonar domes. Unfortunately, rubber and other elastomers do not bond well to the amorphous metallic alloy filaments.

SUMMARY OF THE INVENTION

Accordingly, an object of this invention is to provide a method of coating amorphous metallic alloys with a crystalline metal film.

Another object of this invention is to protect Fe-metalloid amorphous metallic alloy filaments, ribbons, and wires against corrosion.

A further object of this invention is to improve the bonding ability of amorphous metallic alloys to rubber and other elastomers.

Yet another object of this invention is to add electrical conductivity to amorphous metallic alloy wires and ribbons.

These and other objects of this invention are accomplished by:

cathode magnetron sputtering a suitable crystalline metal onto an amorphous metallic alloy sheet, ribbon, fiber, filament, or wire. The cathode is made of the crystalline metal (for example, copper, aluminum, silver, gold) and the sheet, ribbon, fiber, filament, or wire is passed through or passed by the cathode in a continuous coating process. Novel products produced by this process include: copper coated amorphous metallic wires for torpedo and missile controls; shielding materials for electromagnetic waves; and anticorrosion coatings for Fe-metalloid amorphous metallic alloy magnestostrictive elements.

DETAILED DESCRIPTION OF THE PREFERRED EMBODIMENT

In the processes of this invention, magnetron sputtering is used to form good crystalline metal coatings onto passive, poorly electrically conducting amorphous metallic alloys (glassy metals). In contrast to the failure of conventional metal coating techniques such as electroplating, cathode magnetron sputtering produces a good adhesive crystalline metal coating on the amorphous metallic alloy at a reasonable cost. Conventional cold cathode magnetron sputtering methods are used employing a suitable gas, such as argon, at low pressure (2 to 10 millitorr) to provide the plasma. The cathode is made of the crystalline metal to be placed onto the amorphous metallic alloy substrate. Examples of crystalline metals include copper, silver, and gold to provide conductivity and aluminum to provide conductivity and corrosion protection. Hollow cathode magnetron sputtering is used to coat amorphous metal alloy filaments such as fibers, wires, or ribbons. The process may be continuous with the filament passing through the cylindrical hollow cathode at a steady rate. Planar magnetron sputtering may be used to coat sheets and ribbons of amorphous metallic alloys with the crystalline metals, also in a continuous process. In all of these methods the coating thickness is controlled by selecting the deposition rate and the exposure time of the amorphous metallic alloy. This ability to form good crystalline metal coatings on amorphous metallic alloys is useful in producing a number of new products.

For example, new types of guide wires for torpedoes and anti-tank missiles can be made by coating strong amorphous metallic alloy wires with a conductive layer of copper by using cold, hollow cathode magnetron sputtering. Amorphous metallic alloy wires having very high strengths and good fatigue properties are available on the market. Unitika, Inc., of Japan has developed amorphous metallic alloys containing chromium [for example, $(Fe_{0.25} Co_{0.75})_{63.5}Cr_{12.5}Mo_2B_{13}Si_9$] which have excellent strength and fatigue properties. The amorphous metallic alloy wires are also stiff enough to eliminate kinking. Unfortunately, the amorphous metallic alloy wires have high resistivities similar to Nichrome wire (in the range of 130–160 microohms-cm). Their high total resistance makes the wires useless for carrying the necessary electrical control signals to the missiles or torpedoes. This can be overcome by coating the amorphous metallic alloy wire with a conductive coating of copper (resistivity of about 2 microohms-cm). The minimum thickness of the copper layer needed increases with the length of the control wire and the signal to noise ratio needed by the torpedo or missile controls. The required copper coatings can not be produced by electroplating, but rather are produced by cold cathode magnetron sputtering. Preferably, the amorphous metallic alloy wire is coated in a continuous magnetron sputtering process by passing the amorphous metallic alloy wire continuously through a cold, hollow, cathode made of copper, at a rate that produces the desired coatings thickness.

Filaments of these strong amorphous metallic alloys containing chromium would be useful for reinforcing rubber structures except these amorphous metallic alloys do not bond well to rubber or other elastomers. However, by cathode magnetron sputtering a brass coating on these amorphous metallic alloy filaments, a good bond can be achieved with rubber. The resulting brass coated, chromium containing, amorphous metallic alloy filaments can be used to reinforce rubber structures such as tires and sonar domes.

An effective material for screening out electromagnetic waves can be formed by coating a nonmagnetic, electrically conductive crystalline metal (for example Cu, Ag, Au) onto amorphous metallic alloy having a high magnetic permeability but a low electrical conductivity. Fe-metalloid amorphous metallic alloys, such as Allied Chemicals Metglas ® 2605SC ($Fe_{81}B_{13.5}Si_{3.5}C_2$), generally have high magnetic permeabilities. The magnetic permeabilities of filaments (fibers, wires, ribbons) of Fe-metalloid amorphous metallic alloys can be maximized by annealing them in a magnetic field parallel to the long axis of the filament to remove magnetic stress and create an easy axis of magnetization parallel to the long axis of the filament.

The electrically conductive crystalline metal layer is applied to the high permeability amorphous metallic alloy by means of conventional cold electrode magnetron sputtering. Hollow cathode magnetron sputtering will preferably used to coat amorphous metallic alloy filaments. Planar electrode magnetron sputtering will preferably be used to coat amorphous metallic alloy sheets (solid or woven from amorphous metallic alloy filaments or ribbons). The permeability of the amorphous metallic alloy and the thicknesses of the amorphous metallic alloy and crystalline metal coatings will determine the frequencies of electromagnetic wave energy absorbed.

Fe-metalloid amorphous metallic alloy ribbons exhibit extremely high magnetomechanical coupling ($K_{33} > 0.9$) when properly annealed in a transverse magnetic field as disclose in U.S. Pat. No. 4,763,030 titled "Magnetomechanical Energy Conversion" which issue to Arthur E. Clark, et al. on Aug. 9, 1988, herein incorporated by reference. Amorphous metallic alloy ribbons of the formula $Fe_wB_xSi_yC_z$ where $0.78 \leq w \leq 0.83$, $0.13 \leq x \leq 0.17$, $0.03 \leq y \leq 0.07$, $0.005 \leq z \leq 0.03$, and $w+x+y+z=1$ are disclosed to work especially well with such treatment. Strain gauge figures of merit of about $4 \times 10^5$ have been obtain for these materials. Although the patent discloses only the treatment of ribbons, it has been found that the procedure works well with Fe-metalloid wires of the same composition. Such wires, particularly with circular cross-sections minimize the surface to volume ratio and thus the surface effects. Corrosion, although reduced, remains a problem.

Magnetron sputtering offers a method by which protective crystalline metal coating can be applied to amorphous metallic alloy surfaces. The detrimental effects of metal (copper) coatings on the magnetomechanical coupling of the Fe-metalloid amorphous metallic alloy ribbons was shown by M. Wun-Fogle et al. in "Magnetoelastic Effects in Amorphous Wires and Amorphous Ribbons with Nonmagnetic Thin-film Coatings," J. Appl. Phys. 64 (10), pp. 5405–5407, 15 November 1988, herein incorporated by reference. The effect of coating thickness of copper on the magnetomechanical coupling factor and anisotropy field of traverse-field annealed METGLAS ® 2605SC ($Fe_{81}B_{13.5}Si_{3.5}C_2$) ribbons is illustrated in table 1 from that article.

TABLE 1

| Coating Thickness (nm) | $k_{33}$ (max) | Anisotropy field (Oe) | $k_{33}^2/(1 - k_{33}^2)$ |
| --- | --- | --- | --- |
| 31 | 0.98 | 0.9 | 24.3 |
| 62 | 0.91 | 1.0 | 4.8 |
| 93 | 0.88 | 1.3 | 3.4 |
| 123 | 0.86 | 1.5 | 2.8 |
| 186 | 0.80 | 1.6 | 1.8 |

As can be seen, metal coatings of up to about 31 nm (310A) still provide exceptional magnetomechanical coupling. However, the magnetomechanical coupling factor ($k_{33}$) of the amorphous metallic alloy ribbon is substantially reduced at 61 nm (610A) and above.

The reduction in the magnetomechanical coupling factor $k_{33}$ of the METGLAS ® 2605SC ribbon is caused by (1) the dynamic loading of the coating, (2) the intrinsic stress produced during deposition of the coating, and (3) the resistance of the coating to magnetostrictive dimensional changes. Dynamic loading causes less than 1 percent in the reduction of $k_{33}$ and therefore can be ignored. The intrinsic stresses impossed during deposition account for about 90 percent of the reduction in $k_{33}$. This stress can be greatly reduced or eliminated by carefully adjusting the cathode magnetron sputtering conditions to minimize or eliminate the intrinsic stress produced during coating. Finally, the stresses produced by the resistance of the metal coating to magnetostrictive dimensional changes account for about 10 percent of the reduction in $k_{33}$. Unfortunately, there is no way to eliminate this source of stress. To correct this problem, the metal coating is sputtered onto the amorphous metallic alloy while the amorphous metallic alloy is magnetically saturated by a bias field. As a result, the metal coated amorphous metallic alloy magnetostrictive element will be under maximum stress at zero magnetic field but it will near a minimum stress in the bias field during strain measurements.

The thickness of the crystalline metal protective coating on the Fe-metalloid amorphous metallic alloy structure is preferably from about 2 to about 60 and more preferably from 5 to 35 nanometers thick. If a metal (Cu, Ag, Au) that is less electrochemically active than the Fe-metalloid amorphous metallic alloy is used, cracks in the thin protective metal coating will result in the preferential corrosion of the Fe-metalloid amorphous metallic alloy. However, if a crystalline metal (aluminum) which is more electrochemically active than the metallic glass is used, the active metal of the coating will corrode in preference to the Fe-metalloid amorphous metallic alloy. Thus, even if the thin aluminum layer cracks, the Fe-metalloid amorphous metallic alloy will still be protected against corrosion. Accordingly, aluminum is the preferred metal for the corrosion protection layer.

Obviously, numerous modifications and variations of the present invention are possible in light of the above teachings. It is therefore to be understood that within the scope of the appended claims the invention may be practiced otherwise than an specifically described herein:

What is claimed is:

1. A process for coating a magnetostrictive Fe-metalloid amorphous metallic alloy structure having a high magnetomechnical coupling factor with a protective coating against corrosion comprising: cathode magnetron sputter coating the magnetostrictive Fe-metalloid amorphous metallic alloy structure with a crystalline metal selected from the group consisting of copper, gold, silver, and aluminum while the amorphous metallic alloy structure is magnetically saturated in a bias field and wherein care is taken to minimize inherent stresses produced in the amorphous metallic alloy by the deposition of the coating.

2. The process of claim 1 wherein the magnetostrictive Fe-metalloid amorphous metallic alloy is of the formula $Fe_wB_xSi_yC_z$ wherein $0.78 \leq w \leq 0.83$, $0.13 \leq x \leq 0.17$, $0.03 \leq y \leq 0.07$, $0.005 \leq z \leq 0.03$, and $w+x+y+z=1$.

3. The process of claim 1 wherein the crystalline metal is copper.

4. The process of claim 1 wherein the crystalline metal is aluminum.

5. The process of claim 1 wherein the crystalline metal coating is from about 2 to about 60 nanometers thick.

6. The process of claim 5 wherein the crystalline metal coating is from 5 to 35 nanometers thick.

7. The process of claim 4 wherein the aluminum coating is from about 2 to about 60 nanometers thick.

8. The process of claim 7 wherein the aluminum coating is from 5 to 35 nanometers thick.

9. The product produced by the process of claim 5.

10. The product produced by the process of claim 6.

11. The product produced by the process of claim 7.

12. The product produced by the process of claim 8.

13. A magnetostrictive pressure sensing element comprising
 (1) a amorphous Fe-metalloid filament which is a fiber, a ribbon, or a wire of the composition $$Fe_wB_xSi_yC_z$$

wherein $0.78 \leq w \leq 0.83$, $0.13 \leq x \leq 0.17$, $0.03 \leq y \leq 0.07$, $0.005 \leq z \leq 0.03$, and $w+x+y+z=1.00$ wherein the amorphous Fe-metalloid filament has a magnetomechanical coupling factor of greater than or equal to 0.90, is essentially strain free, has a weak axis of magnetization which is transverse (at 90°) to the long axis of the amorphous Fe-metalloid filament, provided that when the filament is a ribbon the weak axis of magnetization is in the plane of the ribbon;
 (2) a coating of a crystalline metal which is copper, gold silver, or aluminum on the amorphous Fe-metalloid alloy structure;
wherein the stress between the crystalline metal coating and the amorphous Fe-metalloid alloy structure is at a maximum in zero magnetic field and at a minimum when magnetically saturated in a bias field.

14. The magnetostrictive pressure sensing element of claim 13 wherein the crystalline metal is copper.

15. The magnetostrictive pressure sensing element of claim 13 wherein the crystalline metal is aluminum.

16. The magnetostrictive pressure sensing element of claim 13 wherein the crystalline metal coating is from about 2 to about 60 nanometers thick.

17. The magnetostrictive pressure sensing element of claim 16 wherein the crystalline metal coating is from 5 to 35 nanometers thick.

18. The magnetostrictive pressure sensing element of claim 13 wherein the filament is a wire.

19. The magnetostrictive pressure sensing element of claim 13 wherein the filament is a ribbon.

* * * * *